United States Patent
Chen et al.

(10) Patent No.: US 7,157,346 B2
(45) Date of Patent: *Jan. 2, 2007

(54) METHOD OF REDUCING CHARGING DAMAGE TO INTEGRATED CIRCUITS DURING SEMICONDUCTOR MANUFACTURING

(75) Inventors: Ko-Ting Chen, Nan-Tou Hsien (TW); Wen-Bin Lu, Hsin-Chu (TW); Chao-Hu Liang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/160,630

(22) Filed: Jul. 1, 2005

(65) Prior Publication Data
US 2006/0270174 A1   Nov. 30, 2006

Related U.S. Application Data

(63) Continuation-in-part of application No. 10/908,815, filed on May 27, 2005.

(51) Int. Cl.
*H01L 29/331* (2006.01)
*H01L 29/76* (2006.01)

(52) U.S. Cl. .................. 438/373; 438/424; 438/401

(58) Field of Classification Search ................ 438/373, 438/401, 424, 68
See application file for complete search history.

(56) References Cited

U.S. PATENT DOCUMENTS 5,998,282 A   12/1999   Lukaszek

OTHER PUBLICATIONS

U.S. Appl. No. 10/908,815.*

* cited by examiner

*Primary Examiner*—Chuong Anh Luu
(74) *Attorney, Agent, or Firm*—Winston Hsu

(57) ABSTRACT

An integrated circuit die includes thereon a first device region, a second device region and a non-active region. A first implant mask, which covers the second device region and the non-active region, while exposing the first device region, is formed over the semiconductor substrate. Dopant species are implanted into the exposed semiconductor substrate within the first device region to form first doping regions therein. A second implant mask is formed over the semiconductor substrate. The second implant mask covers the first device region, while exposing the second device region and a portion of the non-active region. Dopant species are implanted into the exposed semiconductor substrate within the second device region to form second doping regions therein.

6 Claims, 10 Drawing Sheets

METHOD OF REDUCING CHARGING DAMAGE TO INTEGRATED CIRCUITS DURING SEMICONDUCTOR MANUFACTURING

CROSS REFERENCE TO RELATED APPLICATIONS

This is a continuation-in-part of U.S. patent application Ser. No. 10/908,815, filed May 27, 2005.

BACKGROUND OF THE INVENTION

1. Field of the Invention

The present invention relates generally to the field of semiconductor fabrication and, more particularly, to a method of reducing charging damage to integrated circuits during semiconductor manufacturing. The present invention is particularly suited for ion implant processing in an ion implanter without employing a plasma flood system.

2. Description of the Prior Art

Ion implanters and ion implant process are commonly used in the manufacture of semiconductor products for implanting dopant species into wafers or semiconductor substrates to change the conductivity of the material in such substrates. Ion implanters generally comprise an ion source for generating a beam of ions, a mass analyzer for selecting a particular species of ions from the ion beam and means to direct the mass-selected ion beam through a vacuum chamber onto a target substrate supported on a substrate holder. A high-current ion implanter usually encompasses a plasma flood system used to neutralize positive ions.

Influence of ion implant process on wafers has been investigated. It has been revealed that when processing a wafer in plasma ambient or ion implant process environment, charging damage occurs due to surface charge build-up. Such charging damage to integrated circuits can result in costly losses of product.

Typically, damage to thin insulators such as gate oxide sandwiched between a conductive substrate and isolated conductive electrodes on the surface of a wafer (gates) occurs due to current flow through the insulator, driven by a potential difference between the surface electrode and the substrate. During wafer processing, wafer-scale potential differences are caused by global non-uniformities in plasma density and/or electron temperature or, in the case of ion-beam equipment, by spatially imperfect neutralization of the charging caused by the ion beam.

When devices are under the beam in a high-current ion implanter, they are exposed to positive charging from the high-energy ion beam, from "slow" ions (ionized background gases or the plasma used for charge neutralization), and from secondary electrons emitted from the surface of the wafer due to ionic impact. They are also exposed to negative charging from the "electron shower" or the plasma electrons from a plasma flood system used to neutralize positive charging. Therefore, the net positive charging when devices are under the beam is the sum of the positive and negative charging.

Lukaszek in U.S. Pat. No. 5,998,282 describes a method of reducing charging damage to integrated circuits in ion implant and plasma-based integrated circuit process equipment. Charging damage to integrated circuits during ion implantation and plasma processing of integrated circuit die in a semiconductor wafer is reduced by processing scribe lanes during wafer fabrication to facilitate the flow of current to and from the wafer substrate through the scribe lanes during integrated circuit fabrication and reduce current flow through integrated circuit components. Lukaszek also reveals that increasing shunt path current flow within the integrated circuit die is difficult due to circuit layout constraints.

SUMMARY OF THE INVENTION

It is the primary object of the present invention to provide an improved method of reducing charging damage to integrated circuits during semiconductor manufacturing, wherein the difficulty of increasing shunt path current flow within the integrated circuit die is overcome.

In accordance with the claimed invention, a method for reducing charging damage to integrated circuits during semiconductor manufacturing is disclosed. A semiconductor substrate is provided. The semiconductor substrate comprises thereon a number of integrated circuit dies. The integrated circuit dies are separated from each other by scribe lanes surrounding each integrated circuit die. Each integrated circuit die comprises thereon at least a first device region, a second device region and at least one non-active region. A first implant mask is formed over the semiconductor substrate. The first implant mask covers the second device region and the non-active region, while exposing the first device region. Dopant species are implanted into the exposed semiconductor substrate within the first device region to form first doping regions therein. The first implant mask is then stripped. A second implant mask is formed over the semiconductor substrate. The second implant mask covers the first device region, while exposing the second device region and a portion of the non-active region. Dopant species are implanted into the exposed semiconductor substrate within the second device region to form second doping regions therein.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
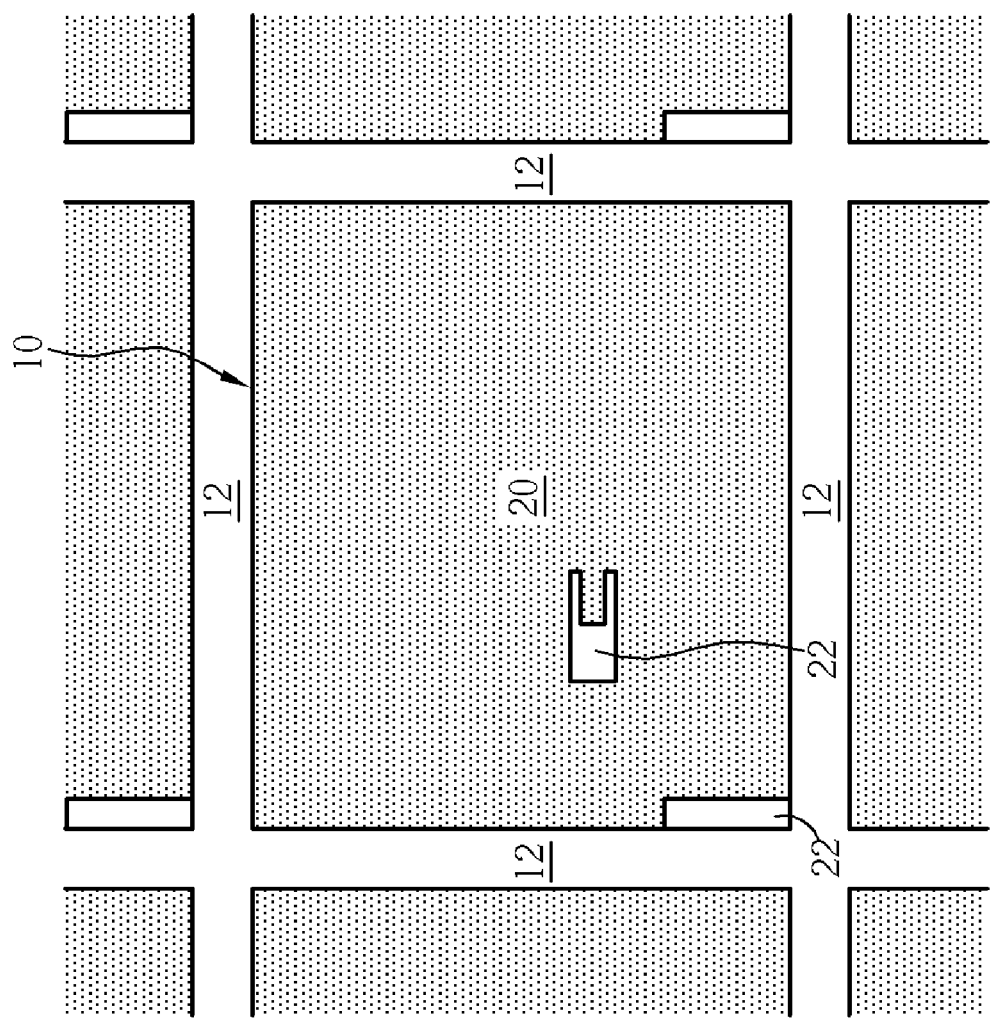
FIG. 1 is a schematic plan view of layout of a photoresist implant mask for implementing lightly doped drain (LDD) regions of high-voltage devices in an integrated circuit die.

In describing the preferred embodiment of the present invention, reference will be made herein to FIGS. 1–2 of the drawings. Features of the invention are not drawn to scale in the drawings.

As previously described, high-current ion implanters are typically equipped with a plasma flood gun, which is an effective apparatus for suppressing positive charging of wafer. In some cases, however, the ion implanter is not equipped or operated with such plasma flood gun, for example, a medium-current ion implanter that is generally used to provide a dosage of about $1E11~1E14$ atoms/cm$^2$ and ion implant energy of about 10 KeV~500 KeV. Such medium-current ion implanters are typically employed to form lightly doped source/drain doping regions in the substrate.

FIG. 1 is a schematic plan view of layout of a photoresist implant mask 20 for implementing lightly doped drain (LDD) regions of high-voltage devices in an integrated circuit die. As shown in FIG. 1, the integrated circuit die 10 is surrounded with scribe lanes 12. A number of test key regions (not explicitly shown) are defined within the scribe lanes 12. Within the integrated circuit die 10, device ion wells, gate oxide layer, polysilicon gates, and shallow trench isolation (STI) region have been formed on the substrate such as a silicon substrate.

The photoresist implant mask 20, which masks a large surface area of the integrated circuit die 10, has small-area openings 22 located at the lower left-hand corner of the integrated circuit die 10. The openings 22 expose the substrate surface of the high-voltage (HV) devices such as HV NMOS devices to be doped with a medium-current ion implanter.

Since the high-voltage devices occupy relatively small part of the die area, the area of the exposed substrate surface through the openings 22 is therefore very small, typically about 0.2%~2% of the die area. It has been found that the small-area openings 22 of the photoresist implant mask 20 during the LDD ion implant process is the root cause of device damage such as polysilicon gate bursting.

In light of the above, there is a need to provide an improved method for making integrated circuits that is able to overcome the above-mentioned LDD doping-related charging damage. Such a method must not, however, introduce any undesired side effects such as decreased device performance or excessively high manufacturing costs.

Figure 2:
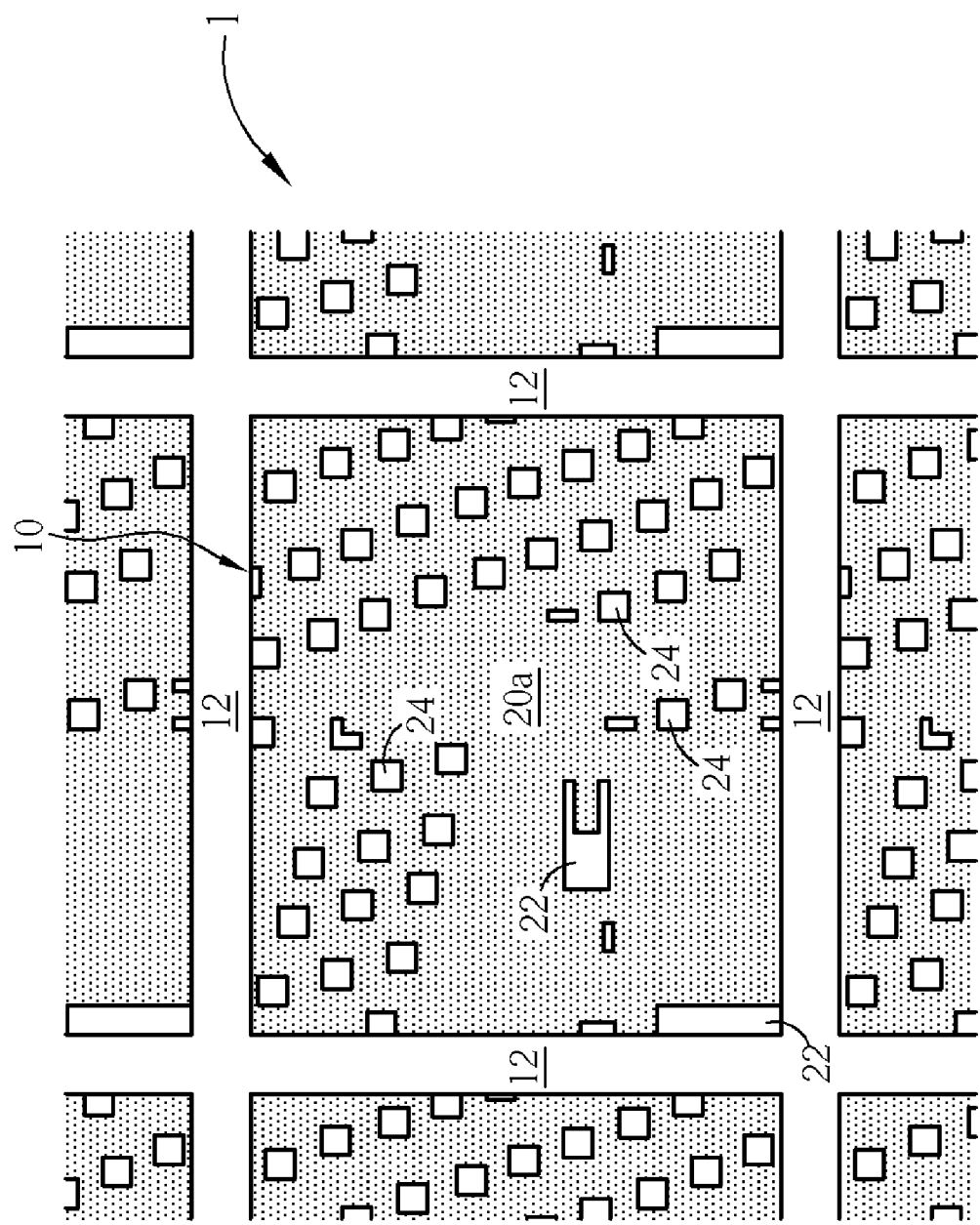
FIG. 2 is a schematic plan view of layout of a photoresist implant mask for implementing LDD regions of high-voltage devices in an integrated circuit die according to one preferred embodiment of the present invention.

Please refer to FIG. 2. FIG. 2 is a schematic plan view of layout of a photoresist implant mask 20a for implementing LDD regions of high-voltage devices in an integrated circuit die according to one preferred embodiment of the present invention, wherein like numerals designate like elements, regions or devices.

As shown in FIG. 2, a semiconductor wafer 1 comprises thereon a number of integrated circuit dies 10 and scribe lanes 12 that separate the integrated circuit dies 10. A number of test key regions (not explicitly shown) are defined within the scribing lanes 12. Within the integrated circuit die 10, device ion wells, gate oxide layer, polysilicon gates, and shallow trench isolation (STI) region have been formed on the substrate such as a silicon substrate.

The photoresist implant mask 20a comprises small-area openings 22 that expose the underlying substrate surface of the high-voltage (HV) devices such as HV NMOS devices to be doped with a medium-current ion implanter. The exposed substrate surface of the HV devices (hereinafter referred to as "exposed device substrate surface") through the openings 22 is typically source/drain region isolated by STI. The photoresist implant mask 20a further comprises dummy openings 24 distributed within the die 10 on the rest of the die area. The scribe lanes 12 may be partly masked. Alternatively, the scribe lanes may be completely clear and opened (not covered by photoresist implant mask 20a).

The dummy openings 24 are deliberately provided for increasing the exposed substrate surface during the LDD ion implant. According to the preferred embodiment, the dummy openings 24 expose non-device area of the substrate surface (hereinafter referred to as "exposed non-device substrate surface"). For example, these dummy openings 24 may encompass the STI dummy patterns used to reduce loading effect during the fabrication of STI. The sum of the exposed device substrate surface and the exposed non-device substrate surface during the LDD ion implant through the openings 22 and 24 is preferably larger than 5% of the die area.

It is advantageous to use the present invention because the additional dummy openings 24 increase the shunt path current flow through the substrate within the integrated circuit die 10, thereby reducing the likelihood of charging damage to the high-voltage devices during LDD ion implant.

Figure 3:
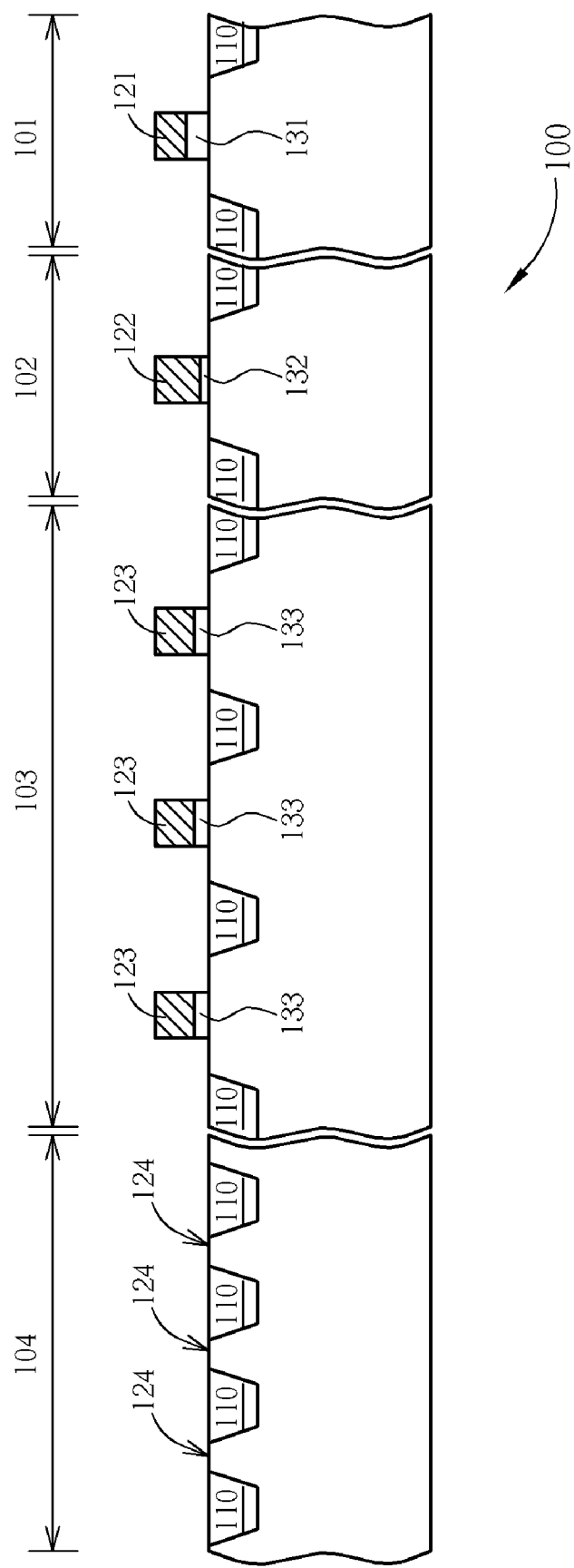
FIGS. 3–6 are schematic, cross-sectional diagrams showing the method of reducing charging damage to integrated circuits during semiconductor manufacturing in accordance with the preferred embodiment of the present invention.

FIGS. 3–6 are schematic, cross-sectional diagrams showing the method of reducing charging damage to integrated circuits during semiconductor manufacturing in accordance with the preferred embodiment of the present invention. As shown in FIG. 3, the semiconductor substrate 100 comprises thereon a high-voltage device region 101, a low-voltage device region 102, a medium-voltage device region 103, and a STI dummy region 104. STI structure 110 is formed in the surface of the semiconductor substrate 100 to electrically insulate electrical components fabricated on the surface of the semiconductor substrate 100. Device ion wells such as P well or N well are not shown.

Within the high-voltage device region 101, high-voltage MOS transistors such as, for example, 5V MOS transistor devices are to be formed therein. A gate electrode 121 of an exemplary high-voltage NMOS transistor is shown in the high-voltage device region 101. The gate electrode 121 is stacked on a thick gate oxide layer 131 and is insulated from the underlying semiconductor substrate 100. Within the low-voltage device region 102, low-voltage MOS transistors such as, for example, 1.8V MOS transistor devices are to be formed therein. A gate electrode 122 of an exemplary low-voltage NMOS transistor is shown in the low-voltage device region 102. The gate electrode 122 is stacked on a gate oxide layer 132 that is thinner than the gate oxide layer 131 and is insulated from the underlying semiconductor substrate 100. Within the medium-voltage device region 103, medium-voltage MOS transistors such as, for example, 3.3V MOS transistor devices are to be formed therein. Gate electrodes 123 of three exemplary low-voltage NMOS transistors are formed within the low-voltage device region 103. Each of the gate electrodes 123 is stacked on a gate oxide layer 133 and is insulated from the underlying semiconductor substrate 100. Within the STI dummy region 104, a plurality of STI dummy features 124 are provided. The plurality of STI dummy features 124 provide exposed semiconductor substrate surface on which no active circuit or electrical component will be formed.

Figure 4:
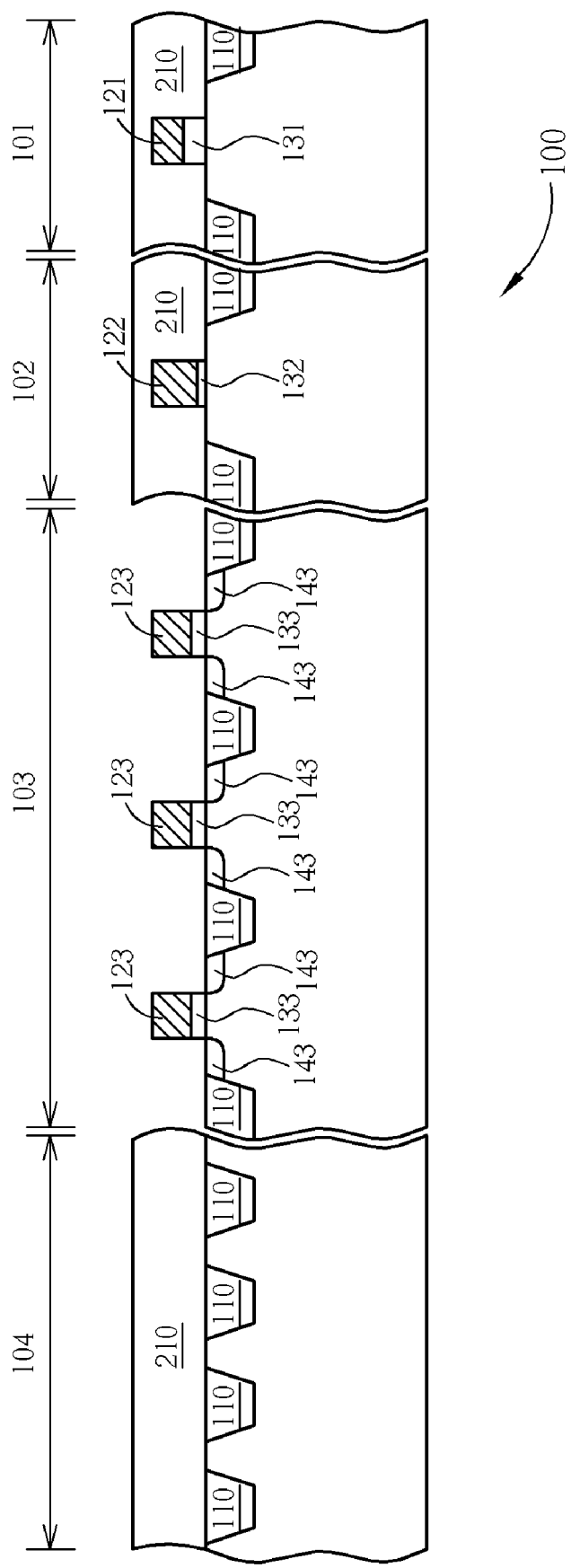

As shown in FIG. 4, an LDD implant photoresist mask 210 is formed over the semiconductor substrate 100. The LDD implant photoresist mask 210 covers the high-voltage device region 101, the low-voltage device region 102 and the STI dummy region 104, while exposing the medium-voltage device region 103. Since the medium-voltage device region 103 occupies a large part of the die area, a large surface area of the semiconductor substrate 100 within each die is exposed at this stage. The semiconductor substrate 100 is then subjected to an LDD ion implant process to implant dopants such as arsenic into the substrate, thereby forming LDD diffusion regions 143 in the medium-voltage device region 103. According to the preferred embodiment, in order to provide suitable dosages, the LDD ion implant process is carried out in a medium-current ion implanter without employing a plasma flood system or plasma flood gun. The LDD implant photoresist mask 210 is then stripped.

Figure 5:
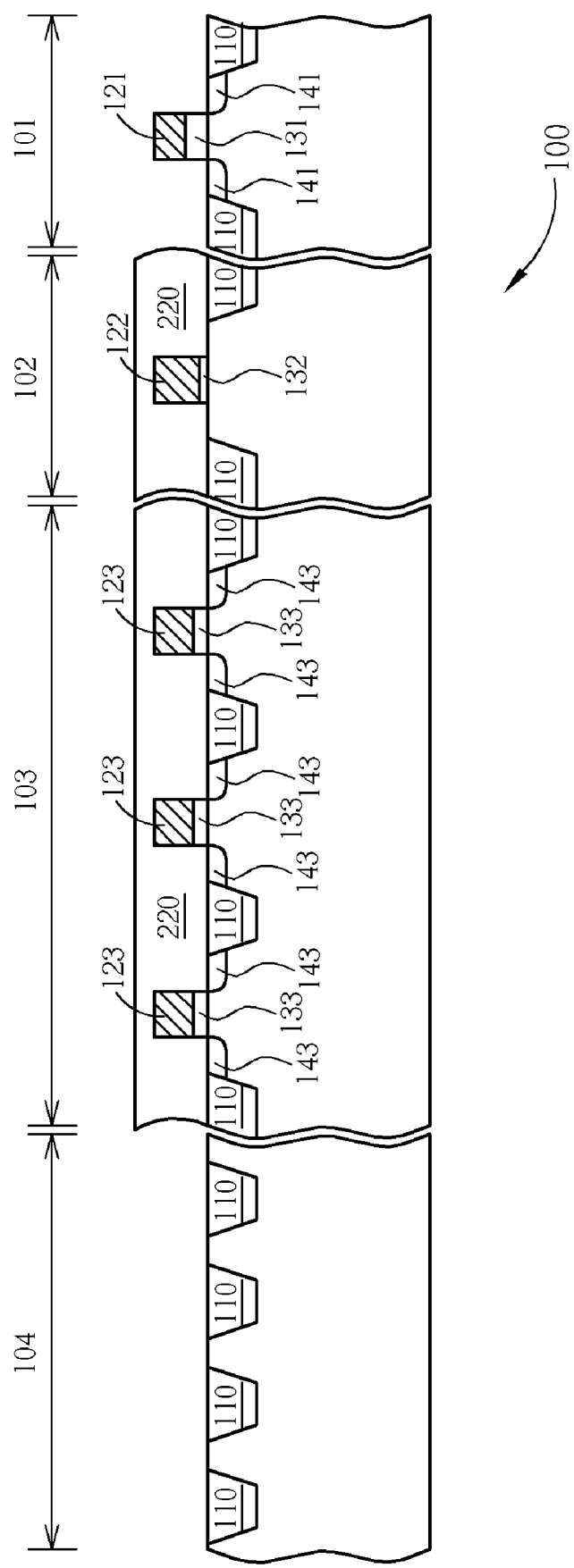

As shown in FIG. 5, another LDD implant photoresist mask 220 is formed over the semiconductor substrate 100. The LDD implant photoresist mask 220 covers the medium-voltage device region 103, the low-voltage device region 102, and exposes the high-voltage device region 101. As previously described, since the high-voltage devices occupy relatively small part of each die area, the exposed surface area of the high-voltage devices during the LDD implant is therefore very small, typically about 0.2%~2% of the die area. In order to increase the exposed surface area of the semiconductor substrate 100 during the LDD implant and to reduce charging damage, the STI dummy region 104 and the plurality of STI dummy features 124 are also exposed though the LDD implant photoresist mask 220.

By doing this, the total exposed surface area of the semiconductor substrate 100 within each die increases up to larger than 5% of each die area. The semiconductor substrate 100 is then subjected to another LDD ion implant process to implant dopants such as arsenic into the substrate, thereby forming LDD diffusion regions 141 in the high-voltage device region 101. According to the preferred embodiment, in order to provide suitable dosages, this LDD ion implant process is also carried out in a medium-current ion implanter without employing a plasma flood system or plasma flood gun. The LDD implant photoresist mask 220 is then stripped.

Figure 6:
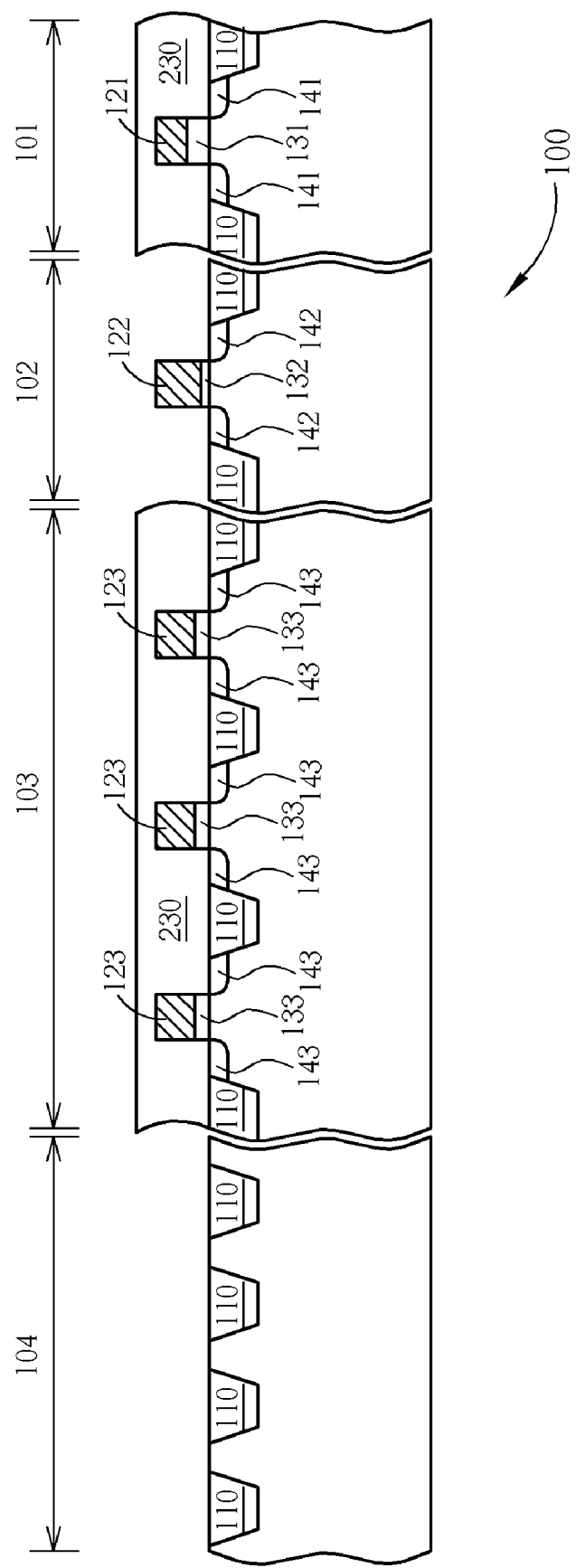

As shown in FIG. 6, still another LDD implant photoresist mask 230 is formed over the semiconductor substrate 100. The LDD implant photoresist mask 230 now covers the medium-voltage device region 103, the high-voltage device region 101, and exposes the low-voltage device region 102, and, optionally, the STI dummy region 104. If the exposed surface area of the high-voltage devices during the LDD implant is small, for example, less than 5% of the die area, the STI dummy region 104 and the plurality of STI dummy features 124 are exposed though the LDD implant photoresist mask 230.

Likewise, the semiconductor substrate 100 is subjected to an LDD ion implant process to implant dopants such as arsenic into the substrate, thereby forming LDD diffusion regions 142 in the low-voltage device region 102. According to the preferred embodiment, in order to provide suitable dosages, this LDD ion implant process is also carried out in a medium-current ion implanter without employing a plasma flood system or plasma flood gun. The LDD implant photoresist mask 230 is then stripped. The subsequent processes include sidewall spacer formation, heavily doped source/drain implant, and salicide processes are omitted. It is noted that the subsequent heavily doped source/drain implant is typically carried out using a high-current ion implanter.

Figure 7:
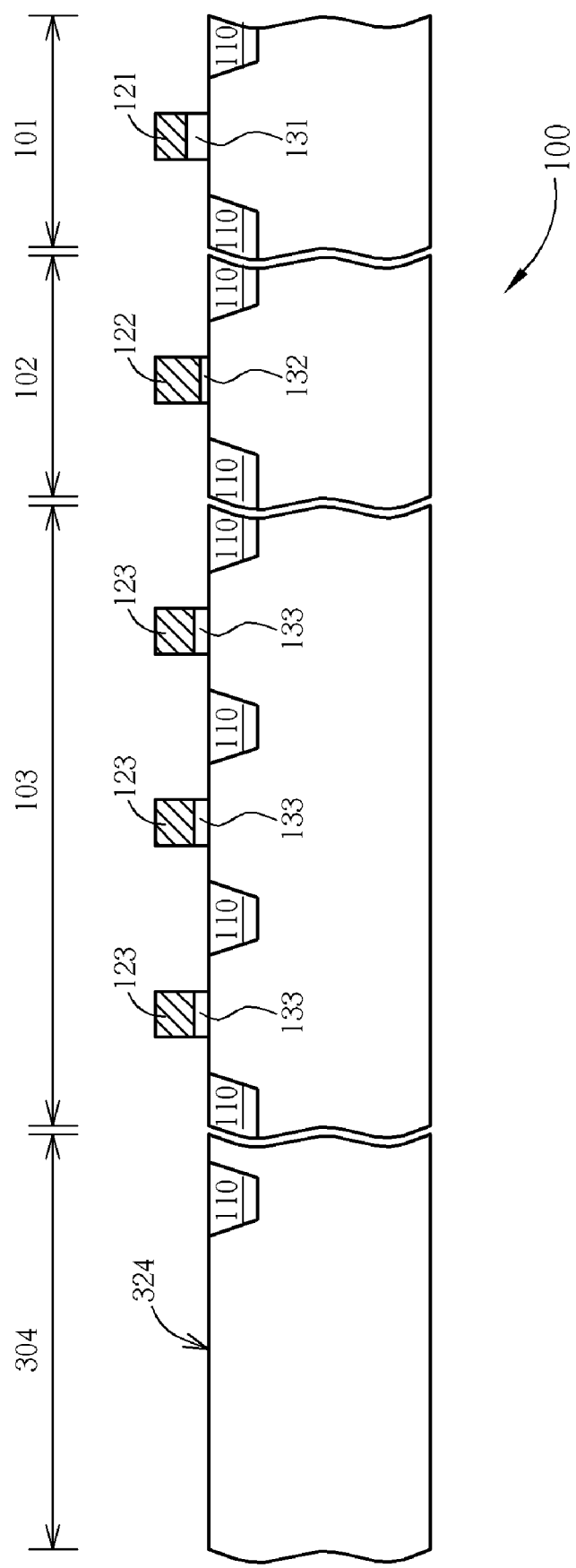
FIGS. 7–10 are schematic, cross-sectional diagrams showing the method of reducing charging damage to integrated circuits during semiconductor manufacturing in accordance with another preferred embodiment of the present invention.

FIGS. 7–10 are schematic, cross-sectional diagrams showing the method of reducing charging damage to integrated circuits during semiconductor manufacturing in accordance with another preferred embodiment of the present invention. As shown in FIG. 7, the semiconductor substrate 100 comprises thereon a high-voltage device region 101, a low-voltage device region 102, a medium-voltage device region 103, and a non-device or non-active region 304. Within the non-active region 304, no active elements will be formed. STI structure 110 is formed in the surface of the semiconductor substrate 100 to electrically insulate electrical components fabricated on the surface of the semiconductor substrate 100. Device ion wells such as P well or N well are not shown for simplicity.

Within the high-voltage device region 101, high-voltage MOS transistors such as, for example, 5V MOS transistor devices are to be formed therein. A gate electrode 121 of an exemplary high-voltage NMOS transistor is shown in the high-voltage device region 101. The gate electrode 121 is stacked on a thick gate oxide layer 131 and is insulated from the underlying semiconductor substrate 100. Within the low-voltage device region 102, low-voltage MOS transistors such as, for example, 1.8V MOS transistor devices are to be formed therein. A gate electrode 122 of an exemplary low-voltage NMOS transistor is shown in the low-voltage device region 102. The gate electrode 122 is stacked on a gate oxide layer 132 that is thinner than the gate oxide layer 131 and is insulated from the underlying semiconductor substrate 100. Within the medium-voltage device region 103, medium-voltage MOS transistors such as, for example, 3.3V MOS transistor devices are to be formed therein. Gate electrodes 123 of three exemplary low-voltage NMOS transistors are formed within the low-voltage device region 103. Each of the gate electrodes 123 is stacked on a gate oxide layer 133 and is insulated from the underlying semiconductor substrate 100. Within the non-active region 104, an exposed, open semiconductor substrate surface 324, on which no active circuit or electrical component will be formed, is provided.

Figure 8:
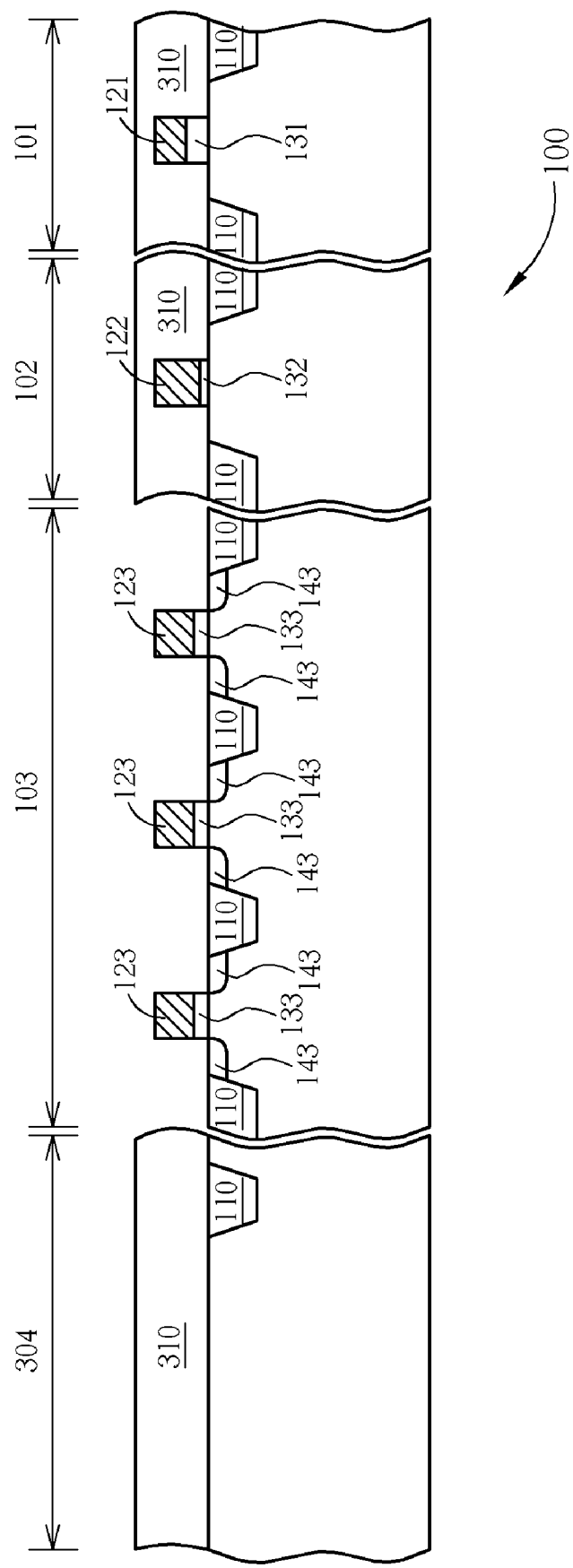

As shown in FIG. 8, an LDD implant photoresist mask 310 is formed over the semiconductor substrate 100. The LDD implant photoresist mask 310 covers the high-voltage device region 101, the low-voltage device region 102 and the non-active region 104, while exposing the medium-voltage device region 103. Since the medium-voltage device region 103 occupies a large part of the die area, a large surface area of the semiconductor substrate 100 within each die is exposed at this stage. The semiconductor substrate 100 is then subjected to an LDD ion implant process to implant dopants such as arsenic into the substrate, thereby forming LDD diffusion regions 143 in the medium-voltage device region 103. According to the preferred embodiment, in order to provide suitable dosages, the LDD ion implant process is carried out in a medium-current ion implanter without employing a plasma flood system or plasma flood gun. The LDD implant photoresist mask 310 is then stripped.

Figure 9:
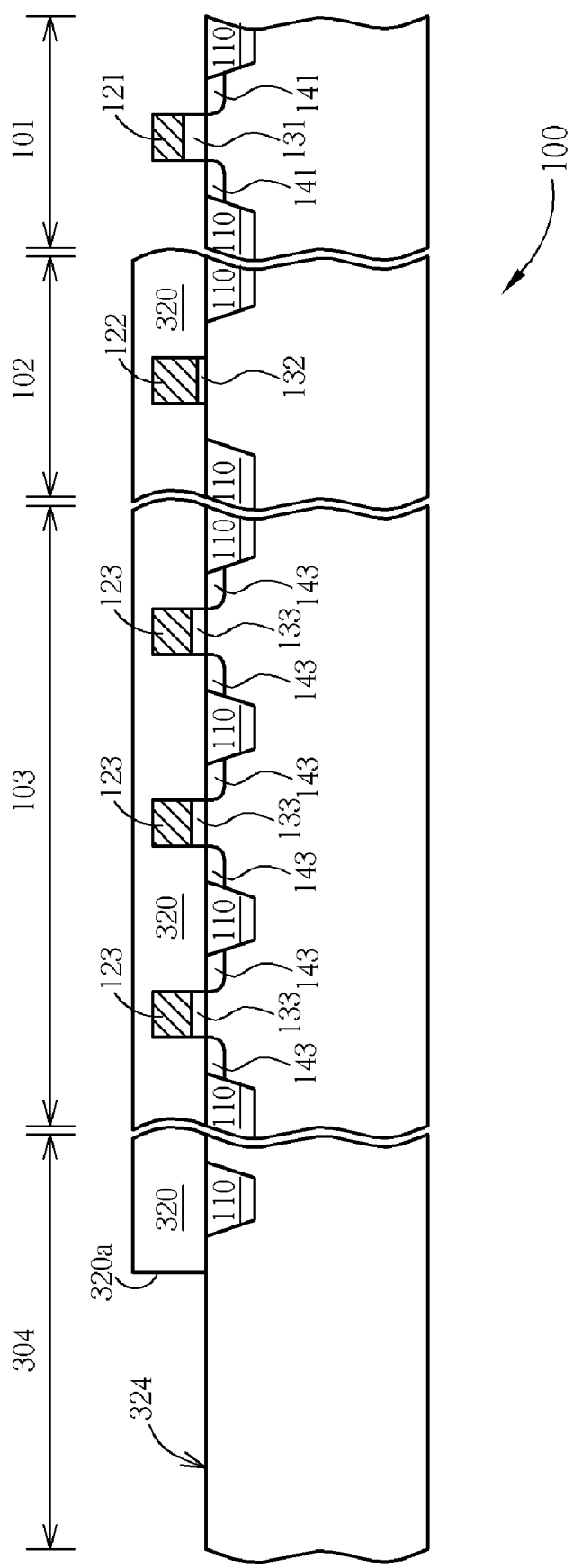

As shown in FIG. 9, another LDD implant photoresist mask 320 is formed over the semiconductor substrate 100. The LDD implant photoresist mask 320 covers the medium-voltage device region 103, the low-voltage device region 102, and exposes the high-voltage device region 101. As previously described, since the high-voltage devices occupy relatively small part of each die area, the exposed surface area of the high-voltage devices during the LDD implant is therefore very small, typically about 0.2%~2% of the die area. In order to increase the exposed surface area of the semiconductor substrate 100 during the LDD implant and to reduce charging damage, the LDD implant photoresist mask 320 comprises an opening 320a that exposes a portion of the non-active region 304, and thus the silicon substrate 324 is exposed to the LDD implant.

By doing this, the total exposed surface area of the semiconductor substrate 100 within each die increases up to larger than 5% of each die area. The semiconductor substrate 100 is then subjected to the LDD ion implant process to implant dopants such as arsenic into the exposed substrate, thereby forming LDD diffusion regions 141 in the high-voltage device region 101. According to the preferred embodiment, in order to provide suitable dosages, this LDD ion implant process is also carried out in a medium-current ion implanter without employing a plasma flood system or plasma flood gun. The LDD implant photoresist mask 320 is then stripped.

Figure 10:
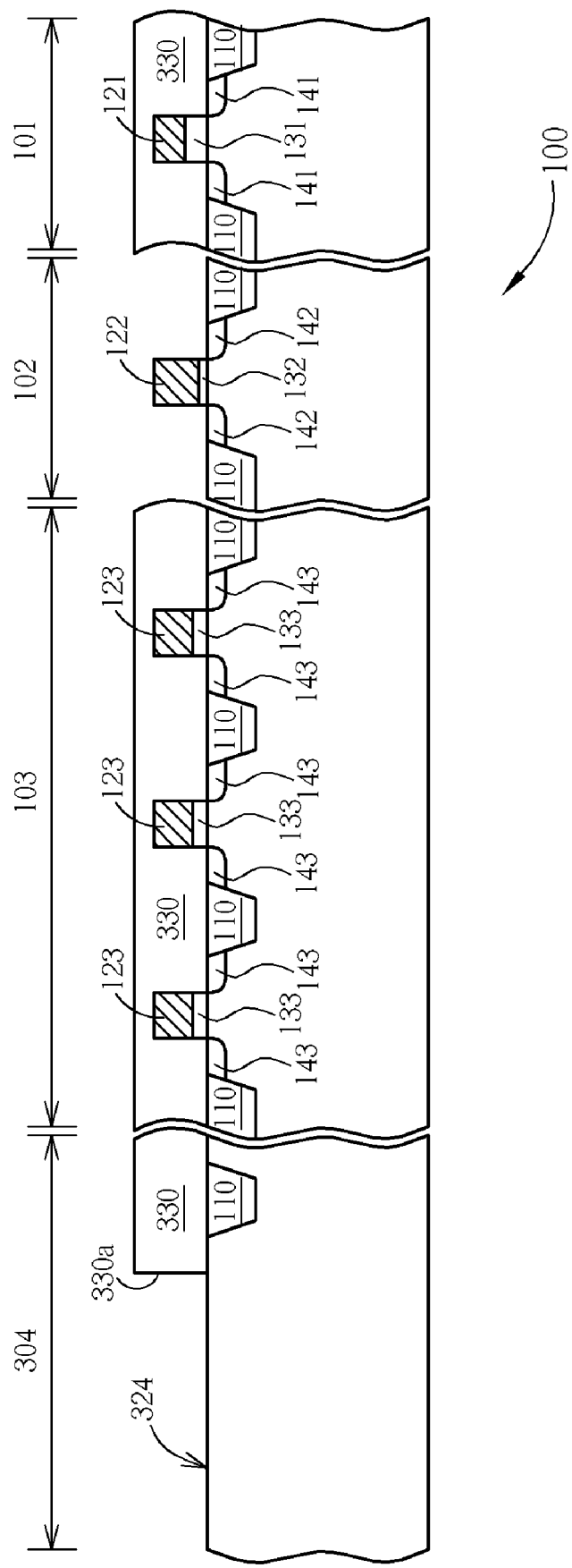

As shown in FIG. 10, still another LDD implant photoresist mask 330 is formed over the semiconductor substrate 100. The LDD implant photoresist mask 330 now covers the medium-voltage device region 103, the high-voltage device region 101, and exposes the low-voltage device region 102. The LDD implant photoresist mask 330 also exposes a portion of the non-active region 304 through the opening 330a that superimposes the opening 320a. According to this invention, the opening 320a and opening 330a are both selected from the STI dummy patterns that used to etch back an excess of the trench fill oxide deposited directly over the non-active region 304 in order to alleviate CMP loading effects.

The semiconductor substrate 100 is then subjected to another LDD ion implant process to implant dopants such as arsenic into the exposed substrate, thereby forming LDD diffusion regions 142 in the low-voltage device region 102. In order to provide suitable dosages, this LDD ion implant process is also carried out in a medium-current ion implanter without employing a plasma flood system or plasma flood gun. The LDD implant photoresist mask 330 is then stripped. The subsequent processes likewise include sidewall spacer formation, heavily doped source/drain implant, and salicide processes are omitted. The subsequent heavily doped source/drain implant is typically carried out using a high-current ion implanter.

It is to be understood that even the above exemplary embodiments reveal the present invention method of reducing charging damage to integrated circuits during LDD implant process of high-voltage MOS devices, this invention should not be limited thereto. The present invention may be applied in other applications such as for example plasma etching process. Furthermore, it is noted that the sequence of ion implanting the high-voltage device region 101, the low-voltage device region 102 and the medium-voltage device region 103 may be changed. For example, in accordance with another preferred embodiment, the LDD regions of the high-voltage device region 101 are implanted first.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reducing charging damage to integrated circuits during semiconductor manufacturing, comprising:
    providing a semiconductor substrate comprising thereon a number of integrated circuit dies, said integrated circuit dies being separated from each other by scribe lanes surrounding each said integrated circuit die, wherein each said integrated circuit die comprises thereon at least a first device region, a second device region and at least one non-active region;
    forming a first implant mask over said semiconductor substrate, said first implant mask covering said second device region and said non-active region, while exposing said first device region;
    implanting dopant species into exposed said semiconductor substrate within said first device region to form first doping regions therein;
    stripping said first implant mask;
    forming a second implant mask over said semiconductor substrate, said second implant mask covering said first device region, while exposing said second device region and a portion of said non-active region; and
    implanting dopant species into exposed said semiconductor substrate within said second device region to form second doping regions therein.

2. The method according to claim 1 wherein a first gate electrode is formed within said first device region, and a first gate oxide layer is interposed between said first gate electrode and said semiconductor substrate.

3. The method according to claim 1 wherein a second gate electrode is formed within said second device region, and a second gate oxide layer that is thicker than said first gate oxide layer is interposed between said second gate electrode and said semiconductor substrate.

4. The method according to claim 1 wherein said second device region is a high-voltage device region, said second doping regions are lightly doped drain (LDD) regions of metal-oxide-semiconductor (MOS) transistor devices to be formed within said high-voltage device region.

5. The method according to claim 4 wherein said MOS transistor devices are NMOS transistor devices.

6. The method according to claim 1 wherein the step of implanting dopant species into exposed said semiconductor substrate within said second device region to form second doping regions therein is carried out using a medium-current ion implanter.

* * * * *